US006400740B1

(12) United States Patent
Karpinski

(10) Patent No.: US 6,400,740 B1
(45) Date of Patent: Jun. 4, 2002

(54) LASER DIODE APPARATUS WITH SUPPORT STRUCTURE

(75) Inventor: Arthur A. Karpinski, Jordan, NY (US)

(73) Assignee: Laser Diode Array, Inc., Auburn, NY (US)

( * ) Notice: Subject to any disclaimer, the term of this patent is extended or adjusted under 35 U.S.C. 154(b) by 0 days.

(21) Appl. No.: 09/425,837

(22) Filed: Oct. 21, 1999

Related U.S. Application Data
(60) Provisional application No. 60/105,237, filed on Oct. 22, 1998.

(51) Int. Cl.$^7$ .......................... H01S 5/024; H01S 5/022
(52) U.S. Cl. ............................................ 372/36; 372/35
(58) Field of Search .............................. 372/34, 35, 43, 372/36

(56) References Cited

U.S. PATENT DOCUMENTS

| | | | |
|---|---|---|---|
| 3,683,296 A | * 8/1972 | Scalise | 331/94.5 |
| 5,033,058 A | * 7/1991 | Cabaret et al. | 372/75 |
| 5,040,187 A | 8/1991 | Karpinski | 372/50 |
| 5,128,951 A | 7/1992 | Karpinski | 372/50 |
| 5,216,688 A | * 6/1993 | Kortz et al. | 372/75 |
| 5,284,790 A | 2/1994 | Karpinski | 437/129 |
| 5,291,504 A | * 3/1994 | Bournes | 372/34 |
| 5,471,491 A | * 11/1995 | Phillips et al. | 372/35 |
| 5,521,936 A | 5/1996 | Irwin | 372/75 |
| 5,627,850 A | 5/1997 | Irwin | 372/43 |

* cited by examiner

Primary Examiner—James W. Davie
Assistant Examiner—Davienne Monbleau
(74) Attorney, Agent, or Firm—Sughrue Mion, PLLC

(57) ABSTRACT

A support structure for the mounting of laser diode arrays, to facilitate the pumping of a suitably-shaped lasing medium, is constituted by a non-planar, preferably generally annularly-shaped, thermally conductive portion having an outer surface and an inner surface, the inner surface being shaped to accommodate an appropriate number of laser diode arrays to pump the medium. The outer surface may have cooling fins provided on the outside to facilitate the removal of heat from the vicinity of the laser diode arrays. Axial or circumferential cooling passages may be provided to facilitate removal of heat from the vicinity of the lasing medium, as well as the arrays. The lasing medium also may be surrounded by a cooling tube through which coolant flows, to facilitate removal of heat from the vicinity of the lasing medium in particular. A plurality of such support structures may be provided to accommodate higher power requirements, and also to enable greater distribution of laser light around and along the lasing medium, for more uniform pumping and/or power distribution. A method of fabricating the support structure, and a resulting diode laser pump apparatus also are disclosed.

55 Claims, 10 Drawing Sheets

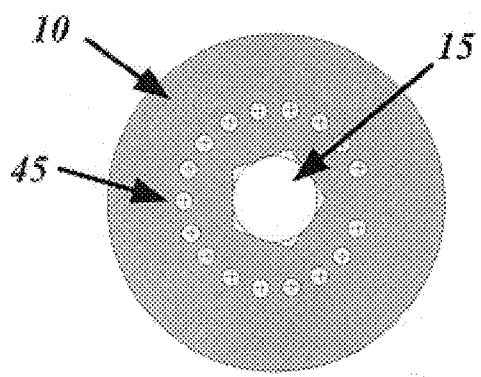 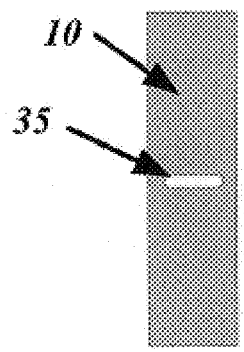
FIG. 4A          FIG 4B
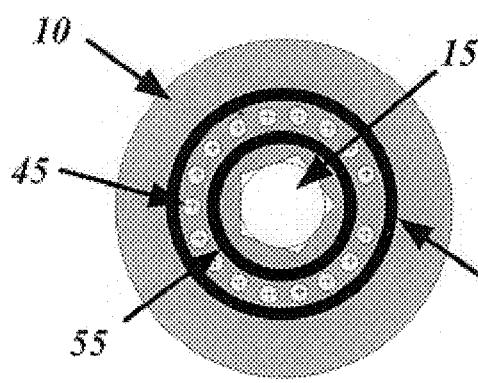 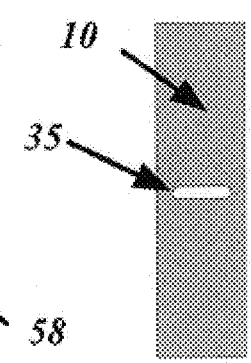
FIG. 5A          FIG. 5B
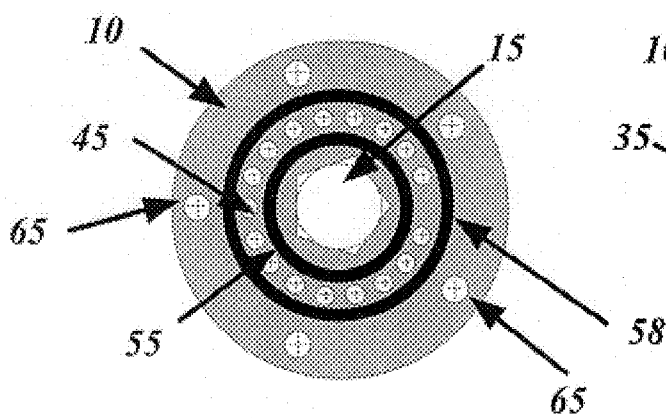 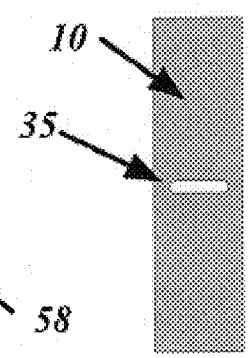
FIG 6A           FIG 6B

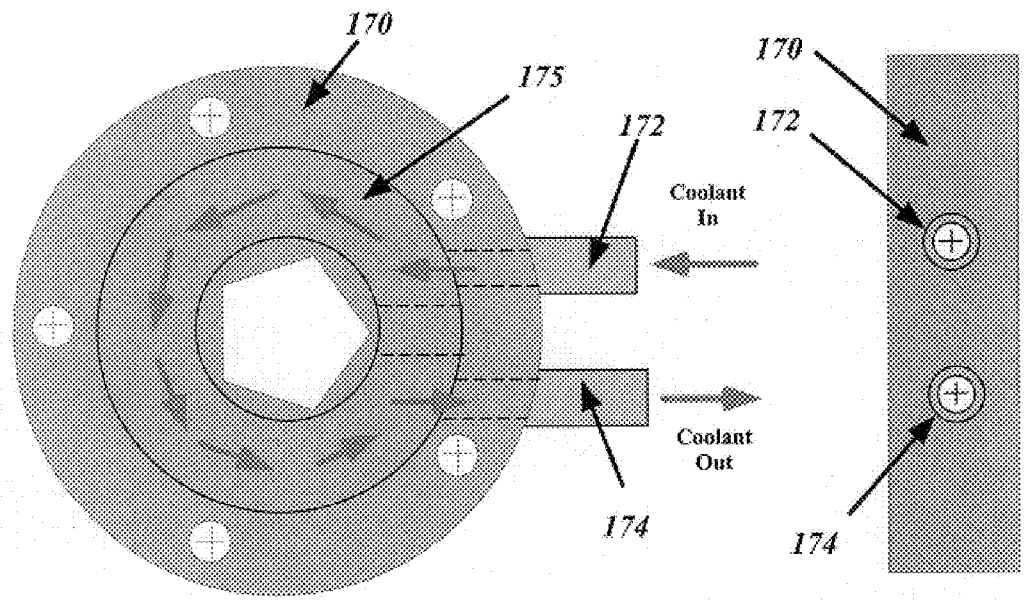
FIG. 17A  FIG. 17B
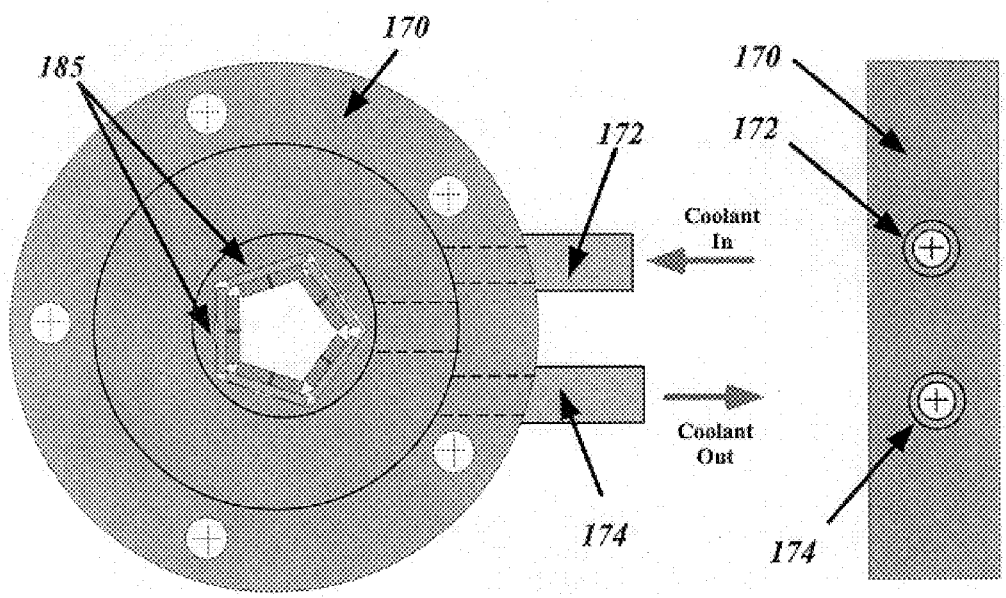
FIG. 18A  FIG. 18B

Single Stack With 5 Sided Pump Donut
Rod Pumped Every 72 Degrees

Two Stack With 5 Sided Pump Donut
Rod Pumped Every 36 Degrees

Three Stack With 5 Sided Pump Donut
Rod Pumped Every 24 Degrees

LASER DIODE APPARATUS WITH SUPPORT STRUCTURE

This application claims domestic priority from Provisional Application No. 60/105,237, filed Oct. 22, 1998.

BACKGROUND OF THE INVENTION

The present invention relates to laser diode arrays, and in particular to support structure which facilitates mounting of laser diode arrays. The invention also relates to a method of fabricating such support structures.

There is a great need to be able to fabricate a simple laser diode array support structure so as to facilitate mounting of laser diode arrays, as well as the directing or aiming of the emission of the laser diodes. There also is a need for simple thermal management of waste heat that the do laser diodes generate. Whether the laser diodes are being used to optically pump a solid state medium, such as a round or a roundish (e.g. elliptical) rod or a multi-sided slab-type medium, there are seven major areas that the laser diode array support structure needs to address:

1) The support structure must facilitate simple attachment of laser diode arrays.
2) The support structure must facilitate mounting of the arrays so as direct the emission of the laser diodes appropriately.
3) The support structure must provide a good thermal path for proper temperature control of the laser diode arrays.
4) The support structure needs to facilitate the making of required electrical connections to the laser diode arrays.
5) The support structure has to enable easy repair of the laser diode arrays contained therein.
6) The support structure has to be simple to manufacture.
7) The support structure should be modular and expandable by combining multiple support structures, as needed, to comply with applicable power requirements, among other things.

While there is considerable prior art regarding laser diode arrays, the inventor is unaware of any known devices, whether actually made or merely described in patent or non-patent literature, which fulfill all or even most of the seven requirements set forth above, nor of a stack made up of such support structures for mounting laser diode arrays, and directing their emission and thermal management. The inventor has coined the name "pump donut" for the inventive support structure for reasons which should be apparent as the description of the invention proceeds.

SUMMARY OF THE INVENTION

In view of the foregoing, it is one object of the present invention to provide a structure which facilitates the mounting of laser diode arrays.

It is another object of the invention to provide a structure which facilitates direction of laser diode array emission toward a suitable lasing medium.

It is yet another object of the invention to provide a structure which facilitates thermal management of laser diode arrays.

It is still another object of the invention to provide a structure which facilitates electrical connections to laser diode arrays.

It is a further object of the invention to provide a structure which facilitates repair of laser diode arrays contained within.

It is a still further object of the invention to provide a structure which is simple to manufacture.

It is a yet further object of the invention to provide a support structure which is expandable by being combinable with other support structures in a modular fashion.

To achieve the foregoing and other objects, in accordance with the present invention a laser diode array support structure, and method of manufacture thereof, are provided. As will be described in greater detail herein, the aiming of laser diode emission toward a suitable lasing medium is facilitated, in a structure which makes it easier to mount laser diode arrays, with good thermal management, electrical connectivity, repair capabilities, and modular expandability.

Also in accordance with the invention, a laser pumping configuration, formed with the inventive support structure, is provided, with laser diode arrays mounted therein, to provide desired emission and direction of laser light toward a lasing medium to be pumped. One or more laser pumping devices may be provided, depending on power requirements, inter alia, to pump a lasing medium in a desired fashion.

BRIEF DESCRIPTION OF THE DRAWINGS

The foregoing and other objects and features of the invention will be better understood when taken with reference to the accompanying drawings, in which:

FIGS. 4A and 4B are an end view and an edge view, respectively, of a further aspect of the invention, also with reference to the first embodiment;

FIGS. 5A and 5B are an end view and an edge view, respectively, of a still further aspect of the invention, also with reference to the first embodiment;

FIGS. 6A and 6B are an end view and an edge view, respectively, of yet another aspect of the invention, also with reference to the first embodiment;

FIG. 12B, show another feature of the invention, relating to stackability of the individual laser pumping devices which can be fabricated using the inventive support structure;

FIGS. 17A and 17B show a further variation of the inventive support structure in which coolant flows around the center, rather than along an axial direction;

FIGS. 18A and 18B shows a support structure variation with the flow around the center, and the laser diode arrays installed;

FIGS. 19A and 19B shows a support structure variation with the flow around the center, the laser diode arrays installed, and the electrical feed through;

FIGS. 22A and 22B show the formation of an opening in a pump donut for an electrical feed-through.

DETAILED DESCRIPTION OF PREFERRED EMBODIMENTS

Before proceeding to discuss the various drawings in detail, it should be noted that, while the indicated scale in the various preferred embodiments is stated to be 1X or 2X, the scalability of the invention toward different sizes, either larger or smaller, should be evident to those of working skill in this technical field. Also, while various exemplary dimensions are shown, the dimensions of the individual laser diode arrays, or of the laser diode support structure, or of the resulting laser diode device, may be varied depending on the end user's requirements for light emission, light directivity, and desired thermal conductivity and electrical connectivity.

Figure 1A:
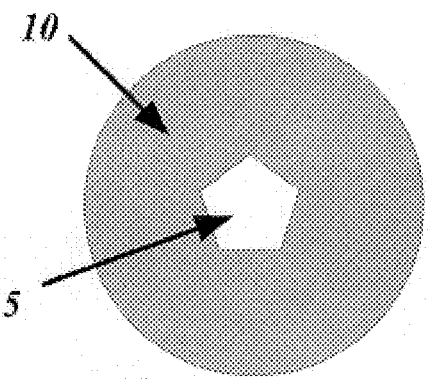
FIGS. 1A and 1B are an end view and an edge view, respectively, of a first embodiment of a laser diode support structure in accordance with the invention.
Figure 1B:
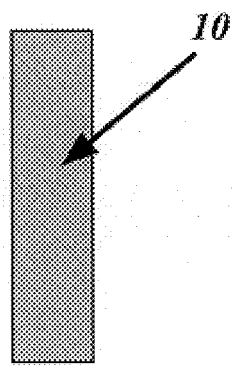
Figure 2A:
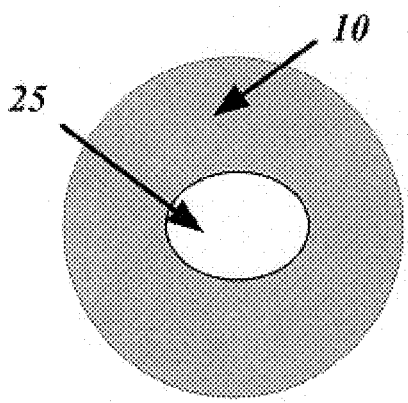
FIGS. 2A and 2B are an end view and an edge view, respectively, of a second embodiment of a laser diode support structure in accordance with the invention.
Figure 2B:
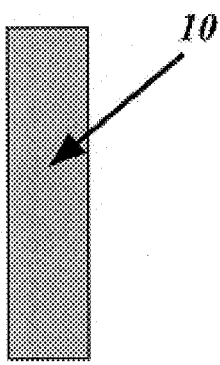

Two preferred embodiments of the inventive support structure for laser diode arrays are shown in FIGS. 1A–1B and 2A–2B. In the illustrated inventive support structure, the mounting area for the laser diodes or laser diode arrays is sized so as to enable acceptance of individual laser diode arrays. FIG. 1A shows a support structure 10 with a five-sided internal area 15; depending on pumping requirements of the lasing medium, inter alia, the number of sides in internal area 15 obviously can be varied. FIGS. 1A and 2A also show a circular outer surface for support structure 10 (hence the name "pump donut" which the inventor has coined for the inventive support structure). However, depending on thermal and other requirements, the shape of the outer surface of support structure 10 obviously can be varied as well.

FIG. 2A shows a more rounded internal mounting area 25 in which the laser diodes or laser diode arrays are to be mounted. While the rounded area is shown to be elliptical in the drawing, the major and minor axes of the ellipse can be altered as desired, depending on the application; the rounded area can even be circular or substantially circular. As can be appreciated by those of working skill, the exact shape of the mounting area will be driven by the application, with respect to aspects that include desired emission; desired direction of laser light; the lasing medium to be pumped; and thermal management and electrical connectivity considerations.

Figure 3A:
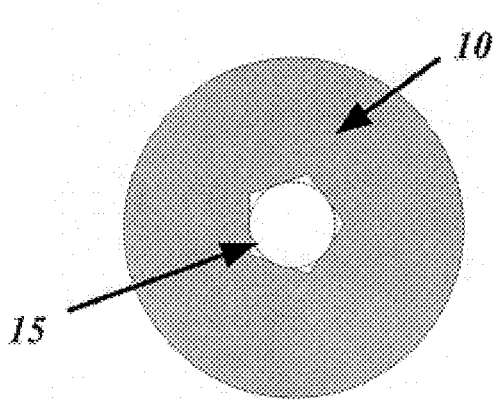
FIGS. 3A and 3B are an end view and an edge view, respectively, of another aspect of the invention, with reference to the first embodiment.
Figure 3B:
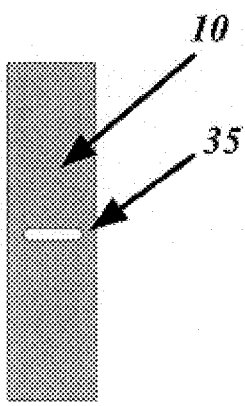

Because electrical power is required for the operation of the laser diodes, one method for electrical access might be through the structure itself, as shown in FIG. 3A, and more specifically in FIG. 3B. FIG. 3B shows an electrical feed-through 35, through which the necessary wiring to arrays mounted on internal surface 15 can pass. Other methods of electrical access and interconnections are within the contemplation of the invention, and will be apparent to those of working skill in this field.

In addition, the inventive structure provides a thermal path for the removal of heat generated during the operation of the laser diodes. In some cases, the mass of the structure would be sufficient to radiate the heat away. However, it also is within the contemplation of the invention to provide cooling fins which are machined into or attached to the outside of the structure. In applications requiring more active cooling, optional coolant passages 45 can be formed, as seen for example in FIG. 4A. Other coolant passage configurations also are possible.

If coolant passages are present, seals such as simple O-rings 55, 58, or other types of seals, can be used within the structure, as seen for example in FIGS. 5A, 6A, 7A, 10A, 11A, 12A, 13A, and 14A. The seals would be provided between adjacent support structures, in order to provide a closed path for passage of coolant through a series of support structures.

FIGS. 6A and 6B are similar to FIGS. 5A and 5B, with the addition of alignment or assembly holes 65 that may be used for stacking multiple support structures or for attaching one of the support structures to other components.

Figure 7A:
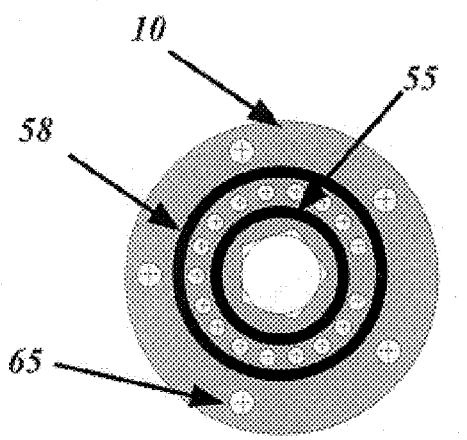
FIGS. 7A and 7B are another version of FIGS. 6A and 6B, highlighting areas of insertion of laser diode arrays.
Figure 7B:
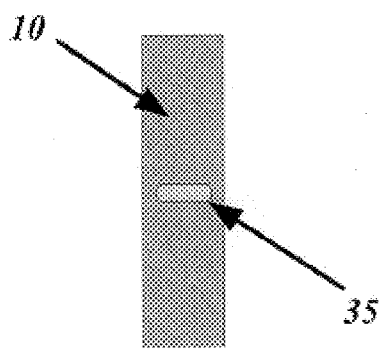

FIGS. 7A and 7B are a version of FIGS. 6A and 6B which highlight the area in which laser diode arrays can be mounted. In the illustrated embodiment, there are five flat areas provided, in a pentagonal shape, for mounting laser diode arrays. However, the exact number of flat sides, or the number of arrays to be mounted, and the shape of the resulting mounting area, will be driven by the application. It should be noted that the mounting areas need not be flat, but may be curved.

Figure 8A:
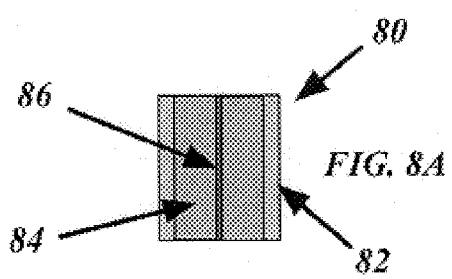
FIGS. 8A and 8B show an example of a generic one bar laser diode array, which may be employed to advantage in the inventive support structure.
Figure 8B:
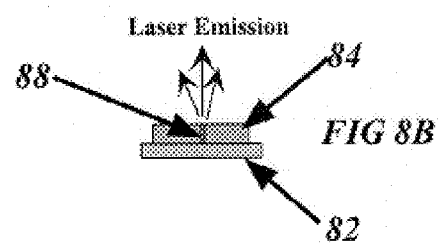

FIGS. 8A, 8B, 9A, and 9B show views of typical laser diode arrays that may be mounted in the inventive support structure. FIGS. 8A and 8B show a generic one-bar laser diode array 80 which may be fabricated using any suitable technique. One example of such a technique has been known generically as "Rack 'n Stack". In accordance with this technique, a lower ceramic surface 82, such as beryllium oxide (BeO) or aluminum nitride (AlN), has a metal layer 84, such as copper or Thermkon™, mounted over it, for example by welding. A diode bar 86 is mounted in a groove 88 in the copper. For simplicity, a one-bar stack is shown. For a multiple bar configuration, there would be one assembly 80 for each bar.

Figure 9A:
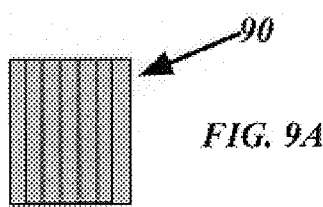
FIGS. 9A and 9B show another example of a generic multi-bar laser diode array, which also may be employed to advantage in the inventive support structure.
Figure 9B:
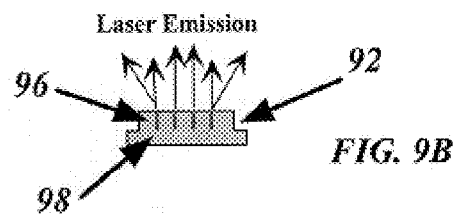

FIGS. 9A and 9B show assembly of a generic laser diode array 90 which also may be fabricated using any suitable technique. Another example of such a technique may be selected from a set of techniques known (as coined by the inventor) as "Bars in Grooves". In accordance with this technique, a ceramic substrate 92 has a laser diode bar 96 formed in a metallized groove 98. The metallization may be provided by any of a number of known metallization techniques. Again, a one-bar array is shown; for multiple bars, multiple metallized grooves 98 would be formed in substrate 92. The inventor's U.S. Pat. No. 5,040,187 describes this technique. The inventor's U.S. Pat. No. 5,128,951 describes a variant of the technique in which an electrically conductive layer has grooves formed in it, in lieu of a metallized groove. The resulting structure may look something like FIGS. 8A and 8B, except that for mounting multiple bars, multiple grooves 88 would be formed in metal layer 84, with one bar 86 being mounted in each groove 88. The contents of these two U.S. Patents are hereby incorporated by reference.

The mounting of the laser diode arrays, whether "Rack 'n Stack," "Bars in Grooves," or some other type of laser diode array, in the support structure allows the arrays to have their laser emission directed as required by the application, and also allows for simple thermal management and electrical connectivity.

It is important to note that, in the foregoing description, there has been no detailed description provided for the fabrication of the individual laser diode arrays that are mounted within the inventive support structure. As has been alluded to previously, the inventor is named on several patents pertaining to fabrication of those arrays. However, at present, the range of permissible techniques for fabrication of the laser diode arrays in the inventive support structure described herein is not limited to those patented techniques. Fabrication of the laser diode arrays themselves, while obviously important to the completion of a laser device employing the inventive support structure, is not a critical element of this invention. Both patented techniques and public domain techniques—indeed, any commercially and/or technologically viable technique—for fabricating the underlying laser diode arrays are within the inventor's contemplation herein as being useful to the construction of the inventive "pump donut". As part of that construction, or any such laser diode array construction or "pump donut" construction, the thermal characteristics of the various elements of the individual arrays obviously must be taken into account in conjunction with the thermal characteristics of the surrounding support structure.

It should be noted that the number or particular configuration of laser diode bars within each of the laser diode arrays may be varied from the number shown in FIGS. 8A, 8B, 9A, and 9B. The particular geometry of the individual arrays, however fabricated, also may vary as desired. More specifically, while a planar configuration is shown in FIGS. 8A, 8B, 9A, and 9B, it is within the contemplation of the invention to provide different geometrical configurations, including but not limited to a so-called curved configuration which may result in an elliptical or cylindrical array. This includes a possible configuration in which the laser diode array has a curved lower surface that is direct bonded with the support structure.

The materials used for fabrication of the laser diode arrays may be selected in conjunction with the materials to be used for the inventive support structure, or vice versa, to provide the necessary or desired matching of thermal and/or electrical characteristics.

Figure 10A:
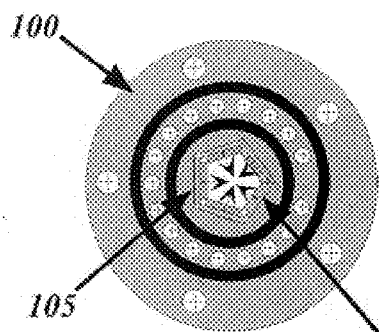
FIGS. 10A and 10B show one example of the inventive laser diode array support structure with laser diode arrays and electrical connections installed.
Figure 10B:
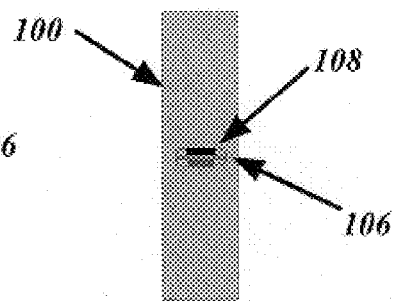
Figure 11A:
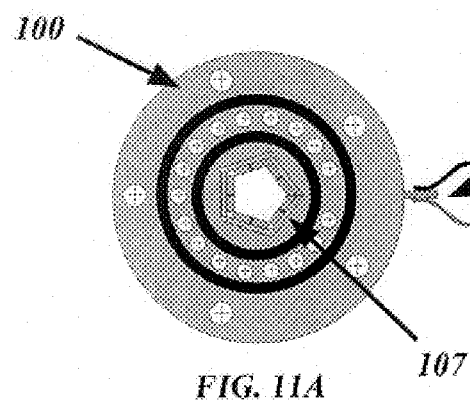
FIGS. 11A and 11B show another view of the support structure of FIGS. 10A and 10B, with illustrative material removed for clarity.
Figure 11B:
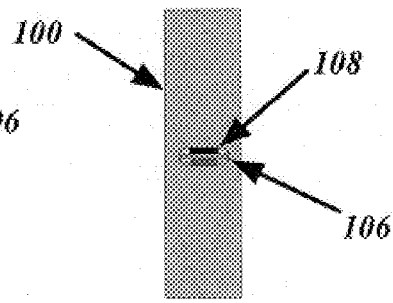

FIGS. 10A and 10B show a typical laser diode array support structure 100. In FIG. 10A, a five-sided internal surface 105 is shown, with a corresponding number of laser diode arrays 107 installed. Again, the fabrication of the laser diode array per se is not part of the invention in this aspect. The point of FIGS. 10A and 10B is to show an example of how the laser diode arrays 107 are installed in the support structure 100. These FIGS. also show an example of electrical feed-through structure 106, and its path through passage 108. FIGS. 11A and 11B are respective views of FIGS. 10A and 10B, with the various arrows and descriptions removed for the sake of clarity.

Figure 12A:
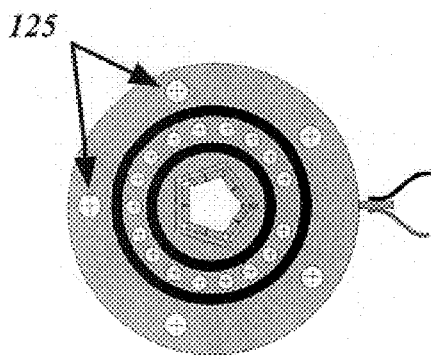
FIGS. 12A and 12B, particularly
Figure 12B:
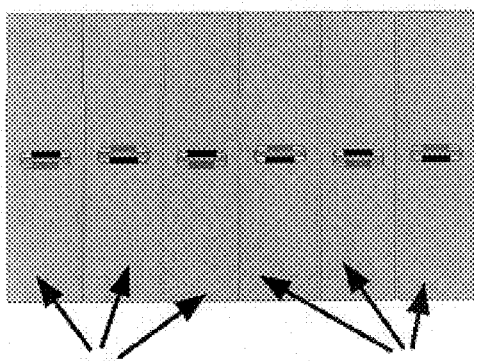

FIGS. 12A and 12B illustrate how individual support structures 120 can be stacked together to form larger assemblies, as might be required by a given application. The attachment holes 125, shown for example in FIGS. 6A and 6B, can be used to advantage here to attach the individual support structures to each other, or attach them together overall. While perhaps not showing up as well in black and white, in accordance with one embodiment of the invention the positive and negative terminals, shown in end view in FIG. 12A, are alternated (with negative and positive terminals occupying what is shown as the upper position in the edge view of FIG. 12B in successive support structures in the stack).

Figures 13A, 13B:
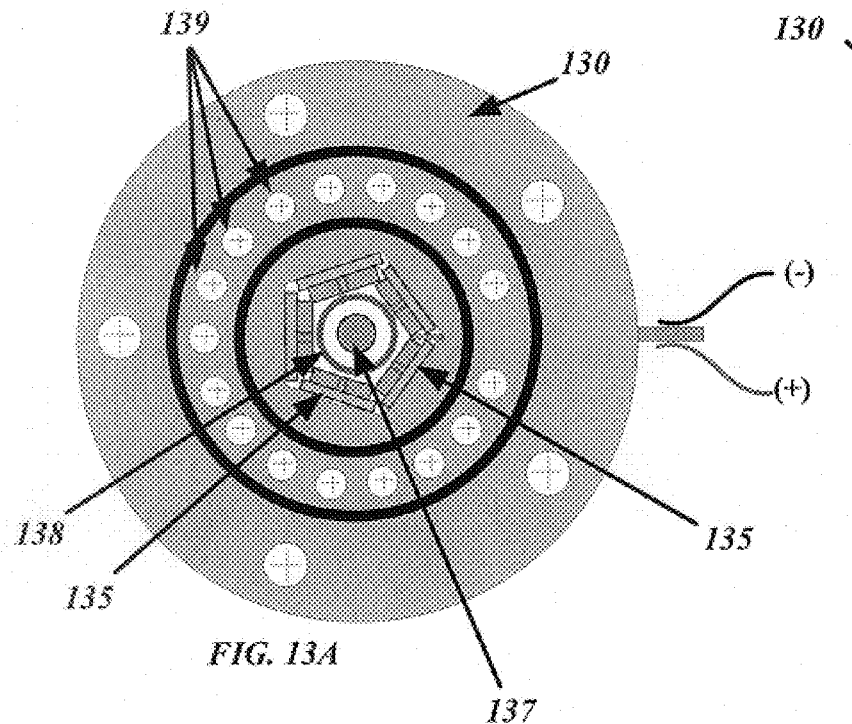
FIGS. 13A and 13B illustrate an application of the invention in which a rod is provided as the lasing medium.

FIGS. 13A and 13B show a typical application of the inventive support structure and laser diode array assembly in a laser device 130. In this embodiment, consistent with what is illustrated in other figures such as FIG. 1A, the support structure is used to hold five laser diode arrays 135. As stated previously, the internal configuration of the inventive support structure may be varied to accommodate different numbers of different laser diode arrays of different sizes, depending on the application. In this embodiment, each laser diode array 135 has two laser diode bars mounted therein. However, once again it should be noted that the specific configuration of the individual laser diode arrays may be varied, depending on the desired application, in accordance with the invention.

The laser diode arrays 135 are mounted so as to direct the emission of the laser diodes toward a lasing medium 137, which in FIG. 13A is a rod. In addition, an optional flow tube 138, surrounding the rod, may be provided to cool the rod. Such structure might be particularly useful in high power applications, in addition to cooling passages 139 through the support structure 130, but the cooling tube is not always necessary.

Figures 14A, 14B:
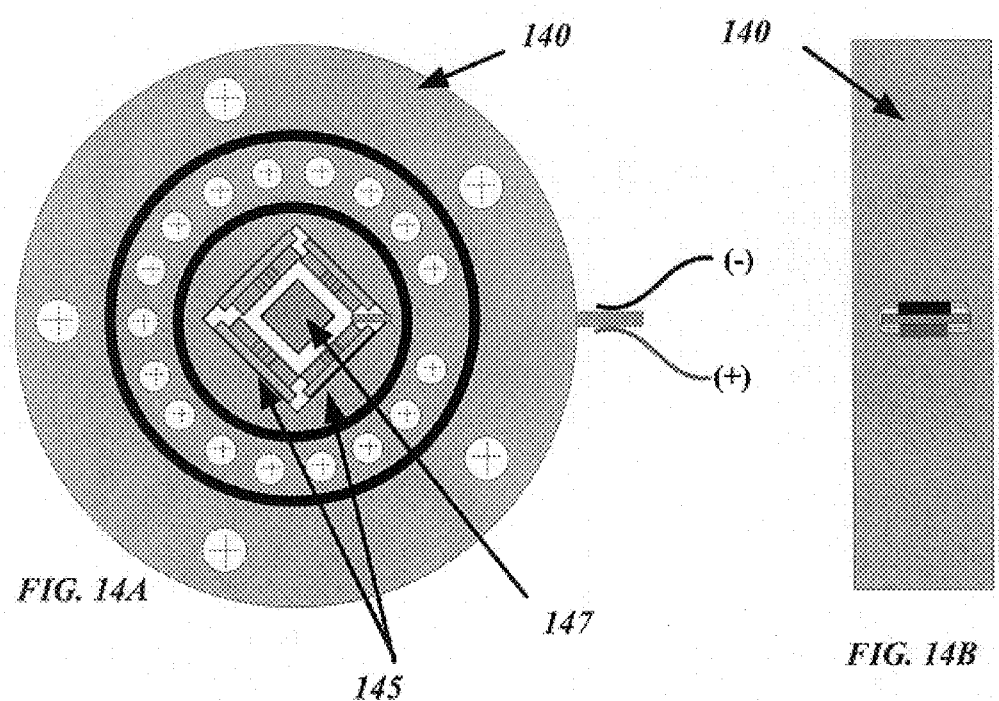
FIGS. 14A and 14B illustrate another application of the invention in which a slab is provided as the lasing medium.

FIGS. 14A and 14B show another typical application of the invention in which the support structure 140 holds four laser diode arrays 145. Each laser diode array 145 in this example is comprised of four laser diode bars, but of course the number of bars may be varied as desired, depending on the application. The laser diode arrays 145 are mounted in this example so as to direct the emission of the laser diodes toward a slab type lasing medium 147. In FIG. 14A, unlike FIG. 13A, no cooling tube is shown, but the provision of a cooling tube would be well within the abilities of the ordinarily skilled artisan, and may be desired, depending on the application.

Figure 15A:
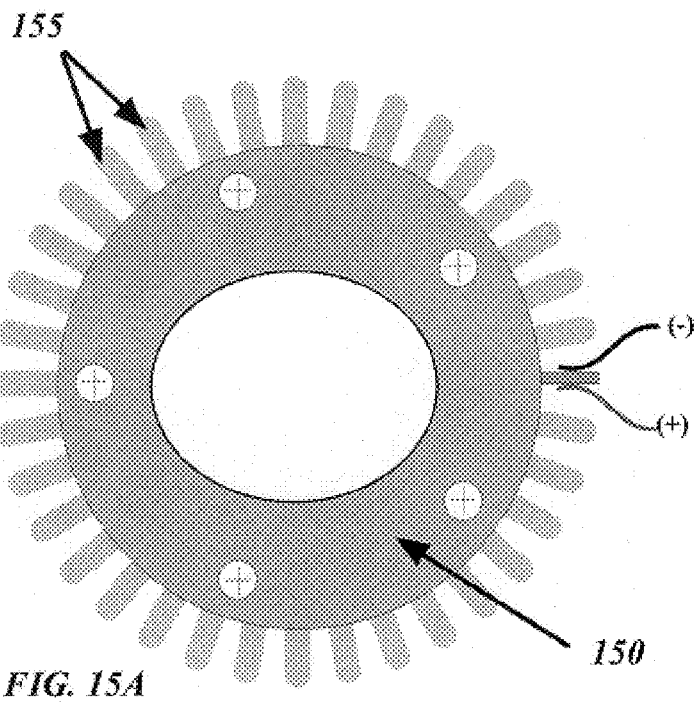
FIGS. 15A and 15B show a variation of the inventive support structure in which cooling fins are provided.
Figure 15B:
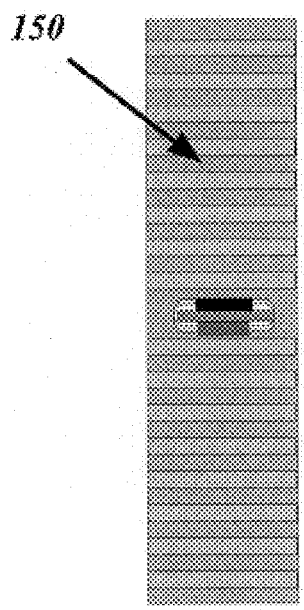

FIGS. 15A and 15B show a variation of the inventive support structure 150 with cooling fins 155. As mentioned above, the cooling fins can be provided to add further heat dissipation capability. As is well known with such structure, heat is conducted through the support structure, to the cooling fins, where the heat is dissipated.

Figure 16A:
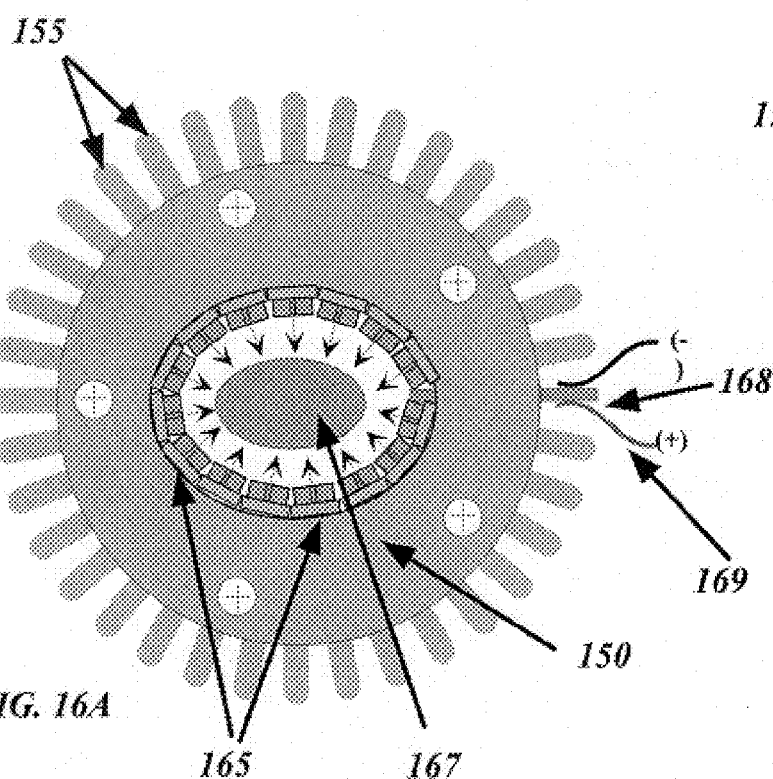
FIGS. 16A and 16B show a further variation of the inventive support structure in which an elliptically-shaped lasing medium is provided.
Figure 16B:
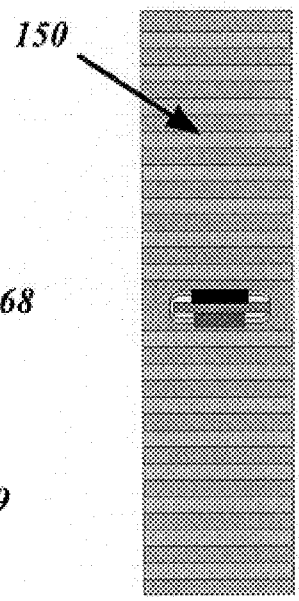

FIGS. 16A and 16B show the cooling fin-added support structure 150 of FIGS. 15A and 15B, with laser diode arrays 165 installed, to pump a lasing medium of desired configuration. Electrical feed-through structure 168 and feeds 169 also are shown. The lasing medium 167 shown has a different configuration from those shown, for example, in FIGS. 13A and 14A, as an illustration of the flexibility of the invention with respect to various lasing media, depending on the application. As can be seen from these Figures, the mounting area is shaped so as to direct the emission of the laser diode arrays 165 as required for the application. As described above with respect to FIGS. 15A and 15B, heat is conducted through the support structure 150, to the cooling fins, where the heat is dissipated.

FIGS. 17A and 17B show another embodiment of the support structure 170, wherein another configuration for cooling is shown. As can be seen from these Figures, a coolant path 175 is provided in circumferential, rather than axial fashion, through support structure 170. Coolant enters through port 172 and exits through port 174 in the side of the support structure 170, while circulating around the laser diode array structure's core to remove heat that is generated by the laser diode arrays. FIG. 17B shows an edge view, particularly of the ports 172, 174.

Figures 19A, 19B:
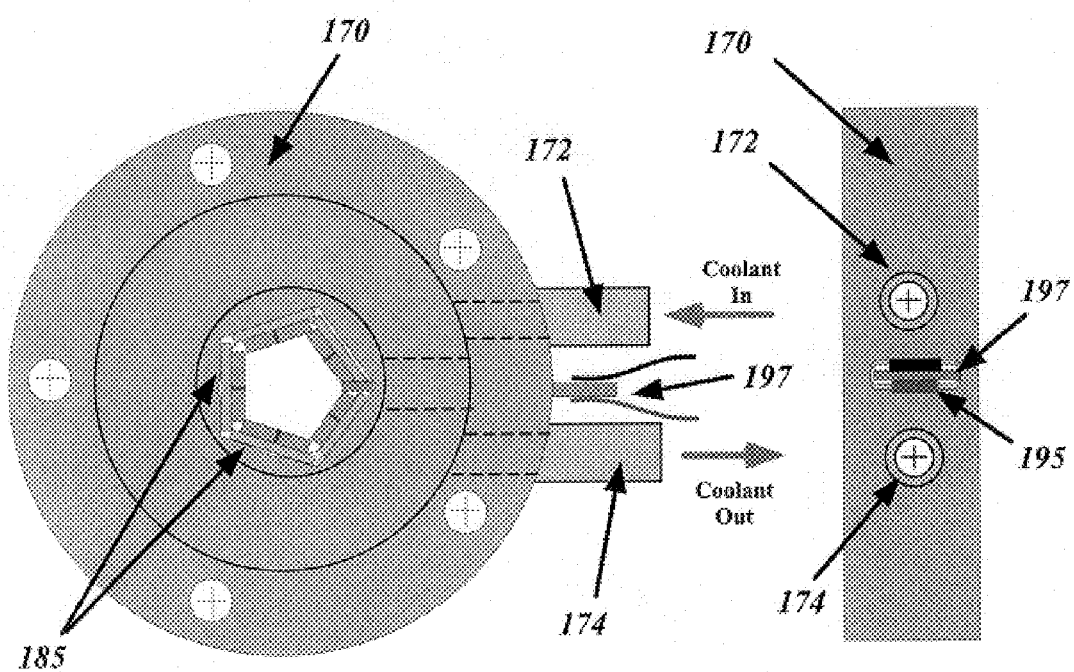

FIGS. 18A and 18B show the support structure 170 of FIGS. 17A and 17B, but with laser diode arrays 185 installed. FIGS. 19A and 19B show the support structure 170 of FIGS. 17A, 17B, 18A, and 18B, but with the addition of electrical feed-through 195, and electrical feed structure 197 passing from the laser diode arrays 185 to the outside of support structure 170.

Figure 20A:
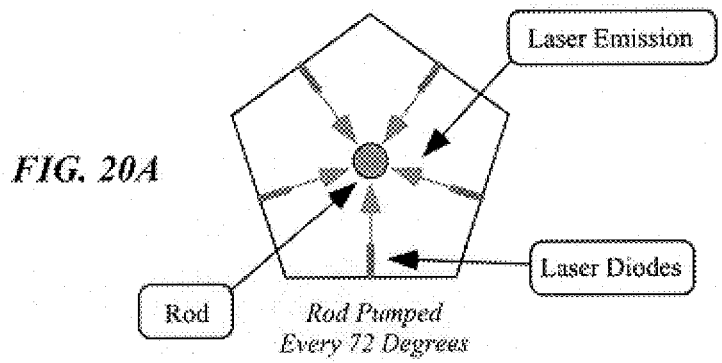
FIGS. 20A, 20B, and 20C show progressive end views of a stacking arrangement of laser diode array support structures, corresponding to FIGS. 12A and 12B, for different numbers of such support structures, with each succeeding structure rotated angularly with respect to the other support structures.
Figure 20B:
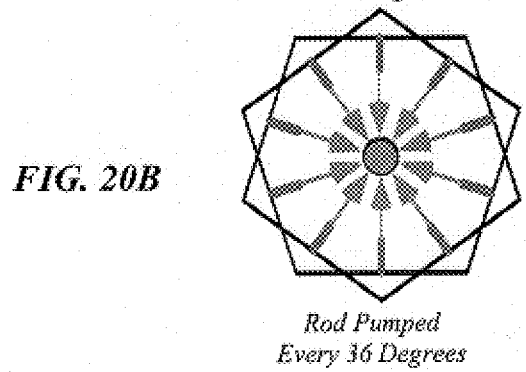
Figure 20C:
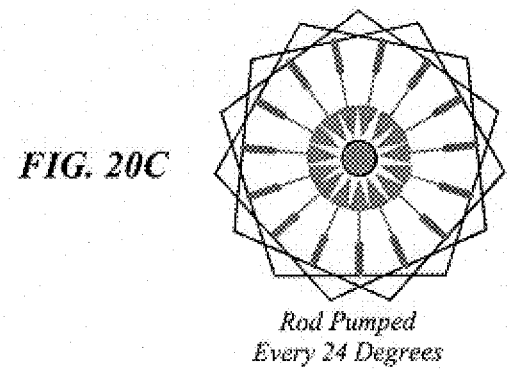

FIGS. 20A–20C are intended to illustrate a variant of FIGS. 12A and 12B which might not be completely apparent from viewing FIGS. 12A and 12B. By way of background, it will be apparent to the ordinarily skilled artisan that the inventive support structure has great utility in pumping a lasing medium that passes through the center of the support structure. For longer lasing media, and accompanying higher power requirements, it will be useful to stack multiple "pump donuts" along a longer lasing medium, as shown in FIG. 12B.

One additional desirable characteristic would be the uniform pumping of the lasing medium. If all of the "pump donuts" are provided with the same relative angular orientation in the same way along the lasing medium, then as be seen in FIG. 12A, the same pentagonal inner cross-section of that embodiment will be visible all along the stack. As a result, all of the arrays in a given position in each respective support structure will direct its emission toward the same portion of the lasing medium. Depending on the number of laser diode arrays per support structure, the uniformity of pumping of the lasing medium may be sufficient, but it is possible to do better.

In accordance with the variant of FIGS. 20A–20C, the "pump donuts" in a stack are rotated with respect to each other, to provide more uniform pumping of the lasing medium. The pump donuts may be rotated by sequentially increasing amounts, as shown in FIGS. 20A–20C, or they may be rotated by different incremental amounts at different places in the stack. The idea is to distribute the laser diode arrays more uniformly around the lasing medium. While FIGS. 20A–20C show a presently preferred way of accomplishing that goal, the actual manner in which the desired uniformity of distribution of the arrays is accomplished will be a function of the application.

Looking more closely now at FIGS. 20A–20C, which are provided only by way of example, FIG. 20A shows a schematic depiction of a five-sided inner surface, with laser diodes pumping a lasing medium from five sides. The five laser diode arrays are disposed around the lasing medium at 72 degree intervals (360°/5). FIG. 20B schematically depicts two support structures having five-sided internal surfaces, and hence each having five laser diode arrays disposed within them, for a total of ten laser diode arrays. In order to dispose the ten laser diode arrays uniformly around the lasing medium, the arrays should be disposed around the lasing medium at 36 degree intervals (360°/10). In order to accomplish this, the second support structure should be rotated by 36 degrees with respect to the first support structure.

FIG. 20C schematically depicts three support structures having five-sided internal surfaces, and hence a total of 15 laser diode arrays. 360°/15=24°, so to achieve uniform distribution of the 15 laser diode arrays around the lasing medium, the second structure can be rotated by 24° with respect to the first structure, and the third structure can be rotated 24° with respect to the second structure. Alternatively, the second structure can be rotated by 48° with respect to first structure, and the third structure can be rotated "back" by 24° with respect to the second structure. Thus, the order of rotation is not critical.

In general, then, it can be seen that, using the inventive support structures, uniform distribution of laser diode arrays around a lasing medium will require disposition of N laser diode arrays at intervals of 360°/N around the lasing medium. In general, then, in accordance with a preferred embodiment, each subsequent support structure should be rotated an amount equal to R=360°/(L×N), where R is the amount of rotation of one support structure with respect to another support structure; L is the number of laser diode arrays per structure, and N is the number of support structures that are stacked.

As mentioned earlier, while presently it is preferred to rotate the "pump donuts" sequentially by the same respective incremental amounts throughout a stack, sequential incremental rotation is not required. The rotation order may be in some other sequence, even a random sequence.

Figure 21A:
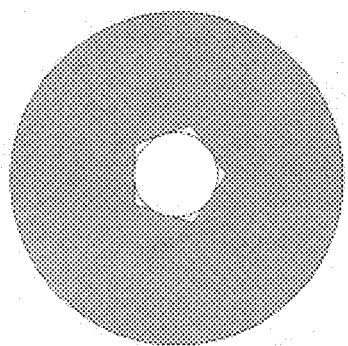
FIGS. 21A and 21B show a generic pump donut.
Figure 21B:
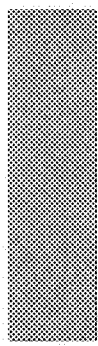
Figure 22A:
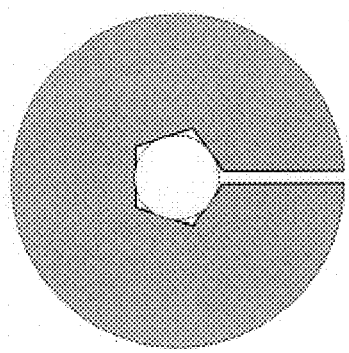
Figure 22B:
Figure 23A:
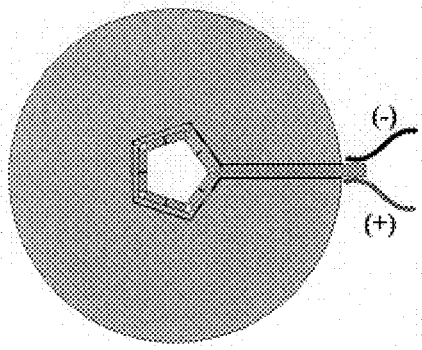
FIGS. 23A and 23B show a typical electrical feed-through in place.
Figure 23B:
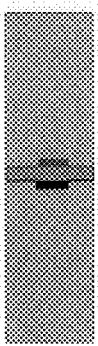

FIGS. 21A and 21B present similar views to FIGS. 1A and 1B, but show, in dotted outline, a lasing medium which may be inserted through a generic pump donut. FIGS. 22A and 22B augment FIGS. 21A and 21B by depicting an exemplary electrical feed-through. Finally, FIGS. 23A and 23B show exemplary feed structure, inserted through the feed-through of FIGS. 21A and 21B.

A typical material for fabrication of the support structure itself would be a material that is thermally conductive. Among presently preferred thermally conductive materials are copper or aluminum, though other materials with desirable thermal conductivity characteristics may be used.

There is no specific reason for the outside shape of the support structure itself to be round, as depicted, but for purposes of simplicity it has been shown as such. It could just as easily be square or any other shape as required by the application. When the outside shape of the support structure is round or elliptical, the term "pump donut" is quite descriptive. If the outside shape is something else (e.g. square, rectangular, or other polygonal configuration), other descriptive names may come to mind.

The shape of the inner surface is shaped to facilitate the mounting of a laser diode array. As such, it has been found that, in the manufacture of many of today's laser diode arrays, the lower surface of the laser diode array is planar, and the support structure surface to which it is attached is planar. Generally, this provides that a cross-section of the inner surface of the outer portion, for a generally annularly-shaped support structure, is a regular polygon having three or more sides. The sides could be expected to be planar because of today's laser diode array fabrication techniques. However, they also can have a curvature, providing a sort of scalloped appearance to the inner surface of the support structure. The lower surface of the laser diode arrays to be mounted then should have a correspondingly gentle curvature, to facilitate mounting. Presently it is believed that a minimum of curvature provides the greatest integrity of the bond between the laser diode array and the support structure, given differences in thermal characteristics, but certainly it is not out of the question for a certain amount of curvature to be acceptable, and even desirable, particularly where the laser diode arrays themselves are not planar, but instead are curved.

The various embodiments of the invention have been shown as including a generally annularly shaped support structure, implying an enclosed area. However, it suffices for the support structure to have a non-planar configuration, with one or both of the inner and outer surfaces having a curved or scalloped cross-section, as described previously, or a cross-section which may be a subset of a regular polygon having three or more sides.

It should be noted that, while the invention has been described in detail above with reference to one or more preferred embodiments, various modifications within the scope and spirit of the invention will be apparent to those of working skill in this technological field. A number of these possible variations have been mentioned above, but the foregoing discussion is not intended to provide an exhaustive list. Thus, the scope and spirit of the invention should be construed with respect to the following claims.

What is claimed is:

1. A laser diode apparatus comprising:
   a thermally conductive support structure having an inner surface and an outer surface; and
   at least one laser diode bar mounted in an array, said array being mounted on the inner surface of the support structure.

2. An apparatus as claimed in claim 1, wherein the support structure is generally annularly shaped.

3. An apparatus as claimed in claim 2, wherein the inner surface of the generally annularly-shaped support structure is sized to accommodate a lasing medium passing through the support structure.

4. An apparatus as claimed in claim 1, wherein a cross-section of the outer surface of the support structure is selected from the group consisting of a circle, an oval, and a polygon.

5. An apparatus as claimed in claim 1, wherein a cross-section of the inner surface of the support structure is selected from the group consisting of a circle, an oval, and a polygon.

6. An apparatus as claimed in claim 1, wherein there are a plurality of laser diode bars, mounted in a plurality of arrays.

7. An apparatus as claimed in claim 6, wherein each of said arrays has at least one laser diode bar mounted therein.

8. An apparatus as claimed in claim 6, wherein each of said arrays has a respective plurality of laser diode bars mounted therein.

9. An apparatus as claimed in claim 6, wherein different arrays have a different number of laser diode bars mounted therein.

10. An apparatus as claimed in claim 6, wherein the plurality of laser diode bars emit light in a direction substantially normal to a surface of the arrays in which the laser diode bars are mounted, in the vicinity of where each of the laser diode bars is mounted.

11. An apparatus as claimed in claim 2, wherein the support structure is provided with at least one coolant passage for the circulation of coolant through the apparatus.

12. An apparatus as claimed in claim 11, wherein the at least one coolant passage is disposed so as to extend circumferentially around the apparatus.

13. An apparatus as claimed in claim 12, wherein the support structure further is provided with an ingress port in said outer surface for the ingress of coolant, and an egress port in said outer surface for the egress of coolant, said ingress and egress ports being connected to said at least one coolant passage.

14. An apparatus as claimed in claim 11, wherein the support structure is provided with a plurality of coolant passages, disposed so as to extend substantially parallel to an axis running through a middle of the support structure.

15. An apparatus as claimed in claim 14, wherein said plurality of coolant passages are disposed so that, when the support structure is viewed from an angle substantially perpendicular to a plane in which said inner surface lies, the coolant passages appear in a ring of a predetermined diameter around said inner surface.

16. An apparatus as claimed in claim 15, further comprising first and second O-rings, said first O-ring having a diameter smaller than said predetermined diameter, and said second O-ring having a diameter larger than said predetermined diameter, said first and second O-rings fitting around said ring of predetermined diameter formed by said coolant passages to aid in preventing loss of coolant flowing through said coolant passages.

17. An apparatus as claimed in claim 2, further comprising a plurality of cooling fins extending from the outer surface of said support structure.

18. An apparatus as claimed in claim 1, wherein the support structure is provided with a plurality of alignment assembly holes for aching the support structure to other support structures.

19. An apparatus as claimed in claim 1, further comprising a plurality of said support structures.

20. An apparatus as claimed in claim 19, wherein each of said support structures has the same number of arrays therein.

21. An apparatus as claimed in claim 19, wherein at least one of said support structures has a different number of arrays from the others of said support structures.

22. An apparatus as claimed in claim 19, wherein all of said support structures are disposed at the same angular orientation.

23. An apparatus as claimed in claim 19, wherein at least one of said support structures has a different angular orientation from the others of said support structures.

24. An apparatus as claimed in claim 19, wherein all of said support structures are disposed at a different respective angular orientation.

25. An apparatus as claimed in claim 24, wherein each respective angular orientation for said support structures is determined in accordance with the following formula:
   $R = M \times 360°/(L \times N)$, where R is an amount of rotation; M is an integer, $1 \leq M \leq N$, each value of M corresponding to a respective one of said support structures in said apparatus; N is a number of support structures in said apparatus; and L is a number of arrays in each of said support structures.

26. An apparatus as claimed in claim 25, wherein said support structures are arranged in a stack, each successive support structure in the stack after the first being rotated by $360°/(L \times N)$ with respect to an immediately preceding one of said support structures in the stack.

27. An apparatus as claimed in claim 25, wherein each successive support structure after the first is rotated by a random integral multiple M of $360°/(L \times N)$ with respect to an immediately preceding one of said support structures in the stack.

28. A method of fabricating laser diode apparatus, said method comprising:
   providing a thermally conductive support structure having an inner surface and an outer surface;

mounting at least one laser diode bar in an array; and
mounting the array on said inner surface.

29. A method as claimed in claim 28, wherein the support structure is generally annularly shaped.

30. A method as claimed in claim 29, wherein the inner surface of the generally annularly-shaped support structure is sized to accommodate a lasing medium passing through the support structure.

31. A method as claimed in claim 28, wherein said providing comprises providing said non-planar support structure with an outer surface cross-section selected from the group consisting of a circle, an oval, and a polygon.

32. A method as claimed in claim 28, wherein said providing comprises providing said non-planar support structure with an inner surface cross-section selected from the group consisting of a circle, an oval, and a polygon.

33. A method as claimed in claim 28, further comprising mounting a plurality of laser diode bars in a plurality of arrays, and mounting said arrays to said inner surface of said support structure.

34. A method as claimed in claim 33, wherein each of said arrays has at least one laser diode bar mounted therein.

35. A method as claimed in claim 33, wherein each of said arrays has a respective plurality of laser diode bars mounted therein.

36. A method as claimed in claim 33, wherein different arrays have a different number of laser diode bars mounted therein.

37. A method as claimed in claim 33, wherein the plurality of laser diode bars are mounted so as to emit light in a direction substantially normal to a surface of the layers in which the laser diode bars are mounted, in the vicinity of where each of the laser diode bars is mounted.

38. A method as claimed in claim 29, further comprising providing the support structure with at least one coolant passage for the circulation of coolant through the apparatus.

39. A method as claimed in claim 38, wherein the at least one coolant passage is disposed so as to extend circumferentially around the apparatus.

40. A method as claimed in claim 39, further comprising providing the support structure with an ingress port in said outer surface for the ingress of coolant, and an egress port in said outer surface for the egress of coolant, said ingress and egress ports being connected to said at least one coolant passage.

41. A method as claimed in claim 38, further comprising providing a plurality of coolant passages which are disposed so as to extend substantially parallel to an axis running through a middle of the generally annularly shaped support structure.

42. A method as claimed in claim 41, wherein said plurality of coolant passages are disposed so that, when the support structure is viewed from an angle substantially perpendicular to a plane in which said inner surface lies, the coolant passages appear in a ring of a predetermined diameter around said inner surface.

43. A method as claimed in claim 42, further comprising providing first and second O-rings with said support structure, said first O-ring having a diameter smaller than said predetermined diameter, and said second O-ring having a diameter larger than said predetermined diameter, said first and second O-rings fitting around said ring of predetermined diameter formed by said coolant passages to aid in preventing loss of coolant flowing through said coolant passages.

44. A method as claimed in claim 29, further comprising providing a plurality of cooling fins on the outer surface of said support structure.

45. A method as claimed in claim 28, wherein the support structure is provided with a plurality of alignment assembly holes for attaching the support structure to other support structures.

46. A method as claimed in claim 28, further comprising providing a plurality of said support structures and a plurality of arrays for each of said plurality of support structures, each of said arrays having at least one laser diode bar mounted therein.

47. A method as claimed in claim 28, further comprising providing a plurality of said support structures and a plurality of arrays for each of said plurality of support structures, each of said arrays having a plurality of laser diode bars mounted therein.

48. A method as claimed in claim 47, wherein each of said support structures has the same number of arrays therein.

49. A method as claimed in claim 47, wherein at least one of said support structures has a different number of arrays from the others of said support structures.

50. A method as claimed in claim 47, further comprising disposing all of said support structures at the same angular orientation.

51. A method as claimed in claim 47, further comprising disposing at least one of said support structures at a different angular orientation from the others of said support structures.

52. A method as claimed in claim 47, further comprising disposing all of said support structures at a different respective angular orientation.

53. A method as claimed in claim 52, wherein each respective angular orientation for said support structures is determined in accordance with the following formula:

$R = M \times 360°/(L \times N)$, where R is amount of rotation; M is an integer, $1 \leq M \leq N$, each value of M corresponding to a respective one of said support structures in said apparatus; N is a number of support structures in said apparatus; and L is a number of laser diode arrays in each of said support structures.

54. A method as claimed in claim 53, further comprising arranging said support structures in a stack, each successive support structure in the stack after the first being rotated by $360°/(L \times N)$ with respect to an immediately preceding one of said support structures in the stack.

55. A method as claimed in claim 53, wherein each successive support structure after the first is rotated by a random integral multiple of $360°/(L \times N)$ with respect to an immediately preceding one of said support structures in the stack.

* * * * *